United States Patent [19]
Miller

[11] Patent Number: 5,311,068
[45] Date of Patent: May 10, 1994

[54] SOLID-STATE ENERGY METER WITH TIME-OF-USE RATE SCHEDULING AND LOAD CONTROL CIRCUIT

[75] Inventor: David J. Miller, South Berwick, Me.

[73] Assignee: General Electric Company, Schenectady, N.Y.

[21] Appl. No.: 704,240

[22] Filed: May 22, 1991

[51] Int. Cl.$^5$ .............................................. H04Q 9/02
[52] U.S. Cl. .................... 307/112; 335/205; 307/119
[58] Field of Search ............. 324/110, 157; 335/151, 335/152, 205-207, 14, 20; 307/140, 119, 118, 117; 361/175, 182, 170, 154, 160

[56] References Cited

U.S. PATENT DOCUMENTS

| | | | |
|---|---|---|---|
| 461,706 | 9/1891 | McCutcheon | 200/18 |
| 3,943,498 | 3/1976 | McClelland, III et al. | 340/206 |
| 4,110,814 | 8/1978 | Britton et al. | 361/371 |
| 4,500,779 | 2/1985 | Killingsworth | 250/231 SE |
| 4,638,314 | 2/1987 | Keller | 340/870.02 |
| 4,654,662 | 3/1987 | VanOrsdel | 340/870.03 |
| 4,673,872 | 6/1987 | Germer et al. | 324/103 R |
| 4,686,461 | 8/1987 | Davis | 324/157 |
| 4,783,623 | 11/1988 | Edwards et al. | 324/156 |
| 4,811,070 | 11/1989 | Burrowes et al. | 340/870.02 |
| 4,910,634 | 3/1990 | Pipkorn | 361/147 |
| 4,977,368 | 12/1990 | Munday et al. | 324/142 |
| 4,994,734 | 2/1991 | Germer et al. | 324/142 |
| 5,001,420 | 3/1991 | Germer et al. | 324/142 |
| 5,027,056 | 6/1991 | Russillo, Jr. et al. | 324/103 R |
| 5,034,682 | 7/1991 | Mayo et al. | 324/142 |
| 5,057,767 | 10/1991 | Keturakis et al. | 324/96 |
| 5,068,962 | 12/1991 | Germer et al. | 324/142 |
| 5,087,875 | 2/1992 | Balch et al. | 324/157 |
| 5,200,723 | 4/1993 | Fujihisa et al. | 335/14 |

OTHER PUBLICATIONS

The EMF-2000 Electronic Register Hardware, ABB, Apr., 1990.
New Delta T.O.U. Technology, Landis & Gyr, 1989.
ST-D101 Electronic Demand Register, Schlumberger, 1989.
SuperMeter II, Domestic Automation, believed to be available as early as 1988.
ST-D101 and ST-MT100 Electronic Register Retrofit Kits, Schlumberger, 1988.
Time-of-Use Modules, Westinghouse, Apr. 1987.
EMF-2000 Universal Electronic Register Family, Westinghouse, believed to be available as early as 1987.
U.S. patent application Ser. 07/799,737 filed Nov. 22, 1991 (Con't of U.S. patent application Ser. 07/505,287, filed Apr. 5, 1990), Art Unit 2607.

*Primary Examiner*—A. D. Pellinen
*Assistant Examiner*—Aditya Krishnan
*Attorney, Agent, or Firm*—Bell, Seltzer, Park & Gibson

[57] ABSTRACT

The present invention comprises, in one embodiment, a load control apparatus comprising a control unit for controlling the supply of power to a load. The control unit has a first state and a second state. When the load control apparatus is disposed in the first state, the control unit enables power to be supplied to the load. When the load control apparatus is disposed in the second state, the control unit prevents power from being supplied to the load. The load control apparatus further comprises a switch for causing the control unit to switch from one state to another. The switch is actuatable external from the control unit.

3 Claims, 2 Drawing Sheets 5,311,068

SOLID-STATE ENERGY METER WITH TIME-OF-USE RATE SCHEDULING AND LOAD CONTROL CIRCUIT

BACKGROUND OF THE INVENTION

1. Field of the Invention

The present invention generally relates to energy metering, and more specifically, relates to a load control means utilized in energy metering applications.

2. Related Art

Energy meters have evolved from the early mechanical meters to solid state meters. Among other advantages, solid state energy meters provide power utility companies with increased flexibility in implementing various rate schedules. More particularly, the solid state energy meters provide increased functionality, such as time keeping, than previous mechanical meters. The meter time keeping function is used, for example, to implement a time-of-use rate schedule.

With a time-of-use rate schedule, the amount of energy consumed during predefined time periods is determined and stored in the meter. The utility company collects such data for billing purposes. In addition to billing a consumer for the total energy used, the utility takes into consideration the time and date when the energy was used.

For example, a utility may define two time periods—from 9:00 a.m. to 8:00 p.m. (Time Period I) and from 8:00 p.m. to 9:00 a.m. (Time Period II). The utility charges a higher rate for each unit of energy used in Time Period I and a lower rate for each unit of energy used in Time Period II. It should be understood, of course, that the above time periods are merely provided by way of example and such time periods typically vary from location to location. The general reasoning for such an approach to billing is that it is more expensive to provide energy during Time Period I (a higher energy usage period) than in Time Period II (a lower energy usage period). Particularly, in order to satisfy consumer energy needs during the high energy use period (Time Period I), more generating power and high voltage rated transformers and lines must be provided.

To reduce energy bills, consumers are encouraged to control the time at which energy is used. Load control devices are used for controlling time of energy usage. An example of an apparatus which can be utilized as a load control device is set forth in U.S. patent application Ser. No. 07/505,287, Late Point Optical Output For Electronic Meter (abandoned in favor of continuation U.S. patent application Ser. No. 07/989,993), which is assigned to the present assignee.

The domestic water heater is probably the most common load controlled in this manner. Particularly, since it is less expensive to heat the water in the hot water heater during the off-peak energy demand time, the load control device prevents energy from being supplied to the hot water heater during the peak demand time period.

Usually a watthour meter in conjunction with a time switch is employed in order that the load may be disconnected during the time of system peak demands. The time switch, for example, may be a time-controlled relay which "opens" during the peak demand time periods and "closes" during the off-peak demand periods. In this manner, energy used for the hot water heater is controlled.

It has been found that relays, if subjected to cycling temperature and humidity prior to installation, may not initially properly operate. It is therefore desirable to be able to test the operation of the relay immediately after installation. With known solid state meters, however, the load control function is controlled by computer code stored in the meter's electronic memory. Access to such code typically can only be obtained by using electronic programmer devices. It would be desirable to provide a simple mechanism to facilitate testing of the load control function without requiring electronic programmer devices or other special tools.

Further, in order to access and test a load control mechanism, it may be necessary to remove the meter cover. When removing a meter cover, however, it is possible that seals which protect the meter components from the external environment may be broken. It would be desirable to enable testing of the load control mechanism without removal of the meter cover.

Moreover, with such a load control mechanism, a customer may not be able to obtain hot water during the peak demand periods. If the water stored in the hot water heater has cooled, the customer would have to wait until the off-peak demand time period to obtain hot water. Having to wait for hot water can become very frustrating. It would be desirable, therefore, to provide a simple and easy to use mechanism so that a customer can override the load control mechanism.

Additionally, if a failure occurs, e.g., the hot water heater breaks down, a customer cannot get hot water when expected. If a service person is dispatched to the customer's house during the peak energy demand time period, however, the water heater is normally de-energized due to the operation of the load control means. The service person therefore must override the load control means so that the hot water heater can be energized and tested. It is advantageous, therefore, to provide an override mechanism for load control means that is easy to access and use.

Although the above discussion uses a hot water heater as an example of a device controlled by load control mechanisms, it should be understood that many other devices could be controlled. The present invention is not limited to use with load control mechanisms for hot water heaters.

SUMMARY OF THE INVENTION

The present invention is a means which facilitates manually overriding a load control mechanism. Particularly, the present load control override means, in one embodiment, includes a magnetic reed switch positioned within the meter and proximate to the meter cover. The magnetic reed switch is coupled so that when closed, the relay changes states. The reed switch can be controlled, from external the meter, by a magnet.

The present invention allows a service person to test the functionality of a controlled device (e.g., water heater) and relays without having to remove a cover, break any seals, or reprogram a meter. Further, no special or expensive electronic programmer devices are required to override the load control mechanism. Only a small magnet is needed. Additionally, the present invention provides that a customer can easily override the load control mechanism.

BRIEF DESCRIPTION OF THE DRAWINGS

These and other objects of the present invention, together with further features and advantages thereof, will become apparent from the following detailed specification when read together with the accompanying drawings, in which.

DETAILED DESCRIPTION OF THE DRAWINGS

Figure 1:
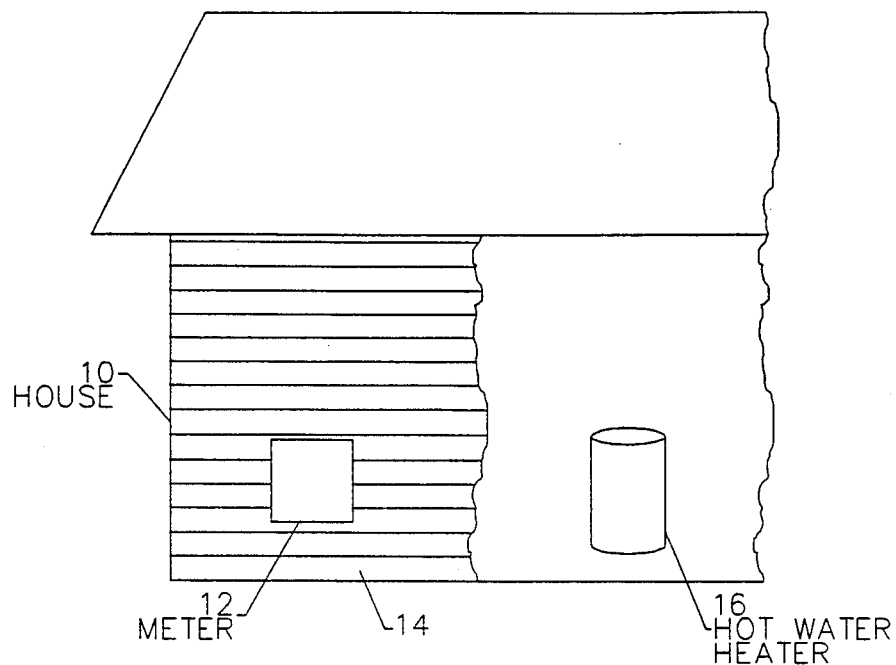
FIG. 1 is a cut-away view of a house showing an energy meter disposed on an outer wall and a hot water heater disposed within the house walls.

Referring to FIG. 1, a partially cut-away view of a house 10 is shown. An energy meter 12 is shown disposed on an outer wall 14 of the house 10 and a hot water heater 16 is shown as being disposed within the house walls. The meter 12 is coupled to power lines (not shown) used to supply energy to a variety of appliances and equipment within the house 10. The hot water heater 16 is shown to illustrate one type of appliance which requires energy.

A load control device 20 may be disposed within the meter 12. The load control device is coupled to appliances to be controlled. Typically, the load control device disposed in the meter 12 serves as a triggering means (or logic means) to control the opening and closing of a remote relay (not shown) disposed at the appliance to be controlled. When the remote relay is in the open condition, energy cannot be supplied to the appliance. When the remote relay is in the closed condition, energy can be supplied to the appliance.

The remote relay disposed at the water heater 16, for example, is a bi-stable relay rated at a voltage compatible with the rating of the water heater 16. One known commercially available relay suitable for this purpose is an Ekstrom adaptor 37 GB 4JHER G2 SP2512 which contains a 35 amp, 1.5 HP relay. Techniques of coupling load control devices to appliances and other equipment are well known in the art.

Figure 2:
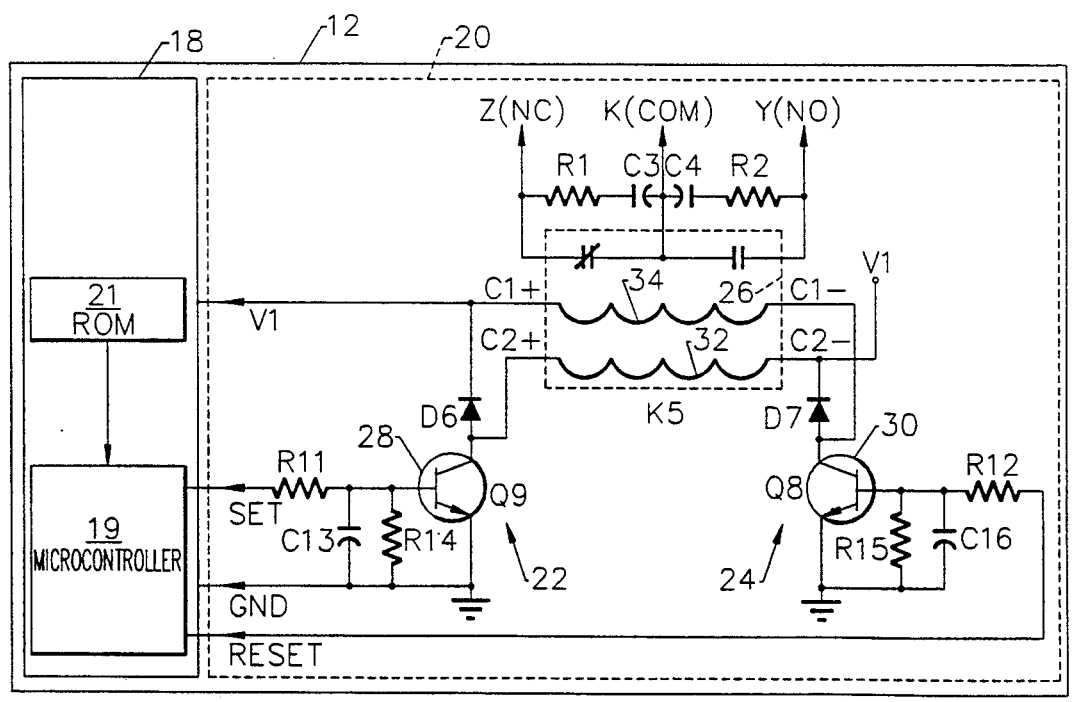
FIG. 2 is a schematic diagram of a meter having a solid-state register and a load control circuit.

FIG. 2 is an example of a load control device 20. The load control device 20, as shown, includes first and second switching means 22 and 24 and relay means 26. The first and second switching means 22 and 24 comprise respective transistors 28 and 30 coupled to respective inputs SET and RESET. The relay means 26 comprises, for example, a bi-stable mercury-wetted relay. Such relays are well known in the art and are commercially available, for example, from CP Clare, Mercury-Wetted Contact Relay, Part No. HGRM52112UOZ, 3101-T W. Pratt Ave., Chicago, Ill. 60645. Table 1 identifies values for some of the respective circuit components (resistors and capacitors) shown as forming the device 20:

TABLE 1

| | |
|---|---|
| R1 | 680 Ohms |
| R2 | 680 Ohms |
| C3 | .0015 uF |
| C4 | .0015 uF |
| R11 | 22K Ohms |
| R12 | 22K Ohms |
| R14 | 100K Ohms |
| R15 | 100K Ohms |

TABLE 1-continued

| | |
|---|---|
| C13 | .01 uF |
| C16 | .01 uF |

Two voltage terminals V1 typically, in operation, are maintained at +16 V. A ground terminal GND also is provided. The voltage V1 typically is provided form the meter voltage coils coupled to the power distribution lines.

Inputs of the device 20 include the set input (SET) and the reset input (RESET). The signals for the SET input and RESET input are provided from a meter register 18. Particularly, as is well known in the art, the meter register 18 typically comprises a microcontroller 19 which operates under the control of a computer program stored in a meter register read only memory (ROM) 21. The meter register further comprises a time keeping function means which enables the meter register to perform certain functions at certain, predetermined times under the control of the ROM stored program. One function performed by the meter register microcontroller 19 is to determine the time at which the load control device 20 should enable/disable energy from those apparatus controlled by the load control device.

Respective outputs from the load control device are labelled Z, K and Y. Typically, the Z and K outputs are coupled to, and control the opening and closing of, the remote relay disposed, for example, at the apparatus to be controlled. In the embodiment shown in FIG. 2, the Z and K outputs, respectively, are the normally closed (NC) and common (COM) outputs, respectively, of the relay means. It should be recognized that the outputs coupled to the apparatus to be controlled may vary depending upon the type of relay utilized in the load control device.

In operation, and for the embodiment illustrated in FIG. 2, if an input pulse from the meter register is provided to the SET input, this causes the relay 26 to latch in the normally closed state. More particularly, by pulsing on the SET input, the transistor 28 is enabled to conduct. This causes a voltage (16 V) to be disposed at the negative terminal C2− of the lower coil 32 of the relay 26. When a voltage is disposed at the C2− relay terminal, the lower relay coil 32 is energized thereby causing the relay 26 to latch in the normally closed state. Since the relay 26 is a bi-stable relay, even after removal of the pulse on the SET input, the relay 26 remains latched in the normally closed condition. When in the normally closed position, the device 26 provides a logic signal to the remote relay disposed at the apparatus which causes the remote relay to latch in the normally closed state. When in the closed position, the remote relay allows energy to be supplied to the water heater.

If an input pulse from the meter register is provided to the RESET input, this causes the relay 26 to latch in the normally open state thereby causing the normally closed switch to open. More particularly, by pulsing on the RESET input, the transistor 30 is enabled to conduct. This causes a voltage (16 V) to be disposed at the positive terminal C1+ of the upper coil 34 of the relay 26. When in this condition, the relay 26 latches in the normally open state. By opening the normally closed switch, energy no longer is supplied to the remote relay from the load control device 20 thereby causing the remote relay to open. When the remote relay opens, energy cannot be supplied to the apparatus.

In this manner, the load control device 20 controls the supply of energy to an apparatus such as a water heater. Further details regarding the load control device 20 can be found in the above-identified U.S. patent application Ser. No. 07/505,287. It should be understood that the foregoing description of a load control device is by way of example only and many other types of load control devices are well known and can be used with the present invention. The present invention can be used with many different types of load control devices in a variety of settings.

Figure 3:
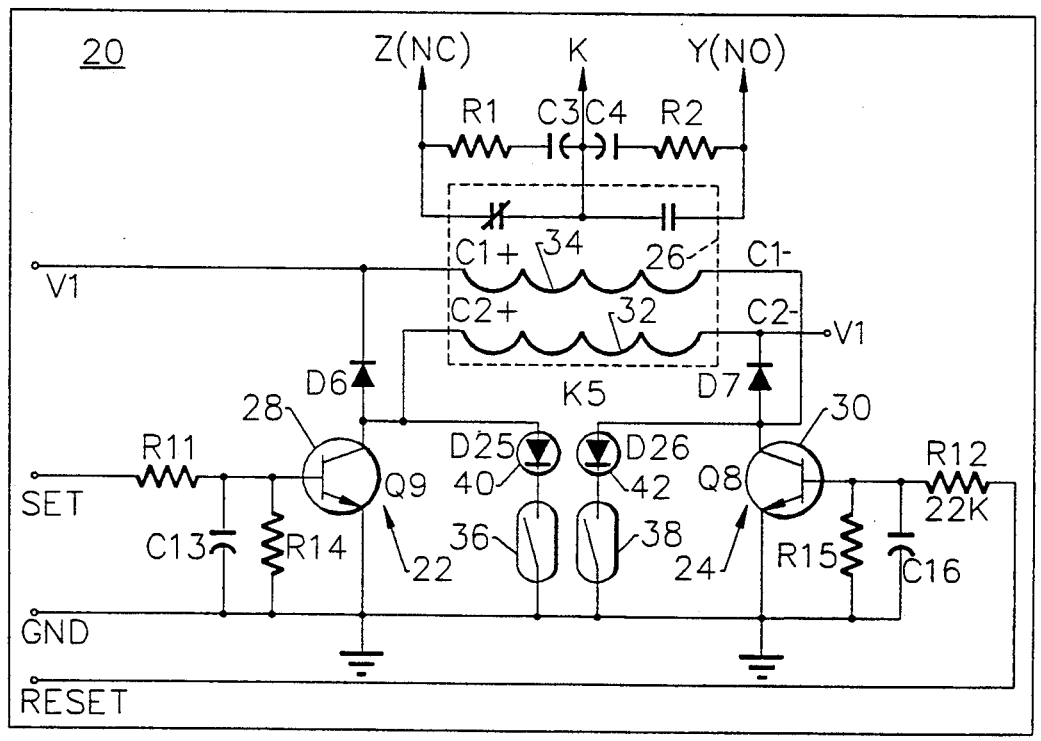
FIG. 3 is a circuit diagram of the load control circuit illustrated in FIG. 2 and including one embodiment of the present load control override means.

FIG. 3 illustrates the load control device 20 shown in FIG. 2 and including one embodiment of the present load control override means. More particularly, two magnetic reed switches 36 and 38, respectively, are shown as being disposed in parallel with respective switching means 28 and 30. The magnetic reed switches 36 and 38 are of a type which are normally open. When a magnet is passed over a magnetic reed switch, the magnetic forces cause the reed switch to pulse into a closed position. The reed switch then returns to the normally open condition. Also shown in series with the respective reed switches 36 and 38 are respective light emitting diodes 40 and 42. When the respective reed switch 36 or 38 is pulsed into a closed condition, the respective LED 40 or 42 emits a light pulse.

In operation, if it is desired to cause the relay 26 to latch into a different state, a magnet is simply passed over one of the reed switches 36 or 38 thereby causing the reed switch 36 or 38 to pulse into the closed state. The relay 26 may then latch into the another state. If the relay 26 does not latch into another state, then the magnet must be passed over the other reed switch 38 or 36 in order to cause the relay 26 to latch into a different state.

More particularly, assume that the relay 26 is initially latched in the normally closed condition. This means that a power signal is provided across the terminals Z and K, and the remote relay is energized to be in a closed condition. Energy therefore is being supplied to the controlled appliance. If a system user desires to manually change the state of the relay 26, then the user simply passes a magnet over the reed switch 38. The reed switch 38 momentarily is disposed in the closed condition and LED 42 will emit a light pulse. Also, a voltage (16 V) will be disposed at the C2− terminal of the relay 26 thereby causing the relay 26 to latch in the normally open condition. The power signal will no longer be present across terminals Z and K thereby de-energizing the remote relay. When the remote relay is de-energized, energy is not provided to the controlled appliance.

Similarly, assume that the relay 26 initially is latched in the normally open condition. This means that no power signal is provided across the terminals Z and K, and the remote relay is de-energized, i.e., in the open condition. Energy therefore is not being supplied to the controlled appliance. If a system user desires to manually change the state of the relay 26, then the user simply passes a magnet over the reed switch 36. The reed switch 36 momentarily is disposed in the Open condition and the LED 40 will emit a light pulse. Also, a voltage (16 V) will be disposed at the C1+ terminal of the relay 26 thereby causing the relay 26 to latch in the normally closed condition. The power signal will be present across terminals Z and K thereby energizing the remote relay. When the remote relay is energized, energy is provided to the controlled apparatus.

The magnetic reed switches 36 and 38 preferably are positioned within the meter and proximate to the transparent meter cover so that a magnet can be easily aligned with and passed over each switch. It is contemplated that other remotely actuated switches could be utilized when practicing the present invention such as, for example, radio, light, and/or pressure actuated switches. It should be understood, of course, that the present invention is not to be limited to the specific connections shown in FIGS. 2 and 3. For example, the connections shown in the Figures are dependent upon the specific relay utilized on the load control device 20. It is contemplated that other types of relays could be used on the load control device 20.

The present invention allows a service person to test the functionality of a controlled device (e.g., water heater) and relays without having to remove a cover, break any seals, or reprogram a meter. Further, no special or expensive electronic programmer devices are required to override the load control mechanism. Only a small magnet is needed. Additionally, the present invention provides that a customer can easily override the load control mechanism.

While the present invention has been described with respect to specific embodiments, many modifications, variations, substitutions, and equivalents will be apparent to those skilled in the art. Accordingly, the invention is to be considered as limited only by the spirit and scope of the appended claims.

I claim:

1. A meter for measuring electrical energy consumed by a plurality of loads, comprising:
    solid-state electronic registering means, for performing time-of-use rate scheduling, based on a plurality of time-of-use rate periods and for generating a first time-of-use control signal during a first time-of-use rate period and a second time-of-use control signal during a second time-of-use rate period;
    load controlling means in said meter, operatively connected to said solid-state electronic registering means and at least one of said plurality of loads, for generating a first load signal for electrically energizing said at least one of said plurality of loads upon the generation of said first time-of-use control signal and for generating a second load signal for electrically deenergizing said at least one of said plurality of loads upon the generation of said second time-of-use control signal; and
    first means electrically connected to said load controlling means and responsive to remote actuation external to the meter, for overriding said load controlling means by causing said load controlling means to generate said first load signal during said second time-of-use rate period.

2. The electrical energy meter of claim 1, further comprising second means electrically connected to said load controlling means and responsive to remote actuation from external the meter, for overriding said load controlling means by causing said load controlling means to generate said second load signal during said first time-of-use rate period.

3. The electrical energy meter of claim 2, wherein said load controlling means comprises a bi-stable relay and wherein each of said first means and said second means comprises a magnetic reed switch.

* * * * *

UNITED STATES PATENT AND TRADEMARK OFFICE
CERTIFICATE OF CORRECTION

PATENT NO. : 5,311,068

DATED : May 10, 1994

INVENTOR(S) : Miller

It is certified that error appears in the above-identified patent and that said Letters Patent is hereby corrected as shown below:

IN THE ABSTRACT:

Please substitute the following Abstract:

A meter for measuring electrical energy includes a solid-state electronic register for performing multiple tasks including a time-of-use rate scheduling task for monitoring not only the total energy consumed by an electrical load(s) but also the time period during which portions of the total energy are consumed. The solid-state electronic register also generates a plurality of time-of-use control signals based on the number of time-of-use rate periods being scheduled. The control signals are supplied to a load control circuit in the meter in order to electrically energize at least one of the loads during a first rate period (e.g., 5 P.M.- 8 A.M.) and de-energize the load(s) during a second rate period (e.g., 8 A.M. - 5 P.M.). By providing time-of-use control of one or more loads which require a relatively large quantity of energy, these loads can be disabled during peak energy demand time periods and enabled during off-peak energy demand time periods, so that the average energy demand on an energy utility can be made approximately equal to the peak demand, thereby saving the utility and consumer money. A load control override circuit is also provided so that the utility or consumer can energize a particular load during a scheduled "off" time period and de-energize the load during a scheduled "on" time period.

UNITED STATES PATENT AND TRADEMARK OFFICE
CERTIFICATE OF CORRECTION

PATENT NO.   :   5,311,068
DATED        :   May 10, 1994
INVENTOR(S)  :   Miller It is certified that error appears in the above-identified patent and that said Letters Patent is hereby corrected as shown below:

On the title page, item [56]:
<u>UNDER "U.S. PATENT DOCUMENTS"</u>:

Reference No. 1, "9/1891" should be -- 10/1891 --.

In Column 1, line 54, after "07/989,993)" change the period (.) to a comma (,).

In Column 5, line 63, "Open" should be -- open --.

Signed and Sealed this

Twenty-seventh Day of June, 1995

Attest:

BRUCE LEHMAN

*Attesting Officer*   *Commissioner of Patents and Trademarks*